US012615842B2

(12) United States Patent
Wang et al.

(10) Patent No.: US 12,615,842 B2
(45) Date of Patent: Apr. 28, 2026

(54) THIN-FILM TRANSISTOR AND ARRANGEMENT THEREOF AND METHOD FOR MANUFACTURING SAME

(71) Applicant: BOE Technology Group Co., Ltd., Beijing (CN)

(72) Inventors: Lizhong Wang, Beijing (CN); Tianmin Zhou, Beijing (CN); Hehe Hu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 685 days.

(21) Appl. No.: 17/921,322

(22) PCT Filed: May 28, 2021

(86) PCT No.: PCT/CN2021/096622
§ 371 (c)(1),
(2) Date: Oct. 25, 2022

(87) PCT Pub. No.: WO2021/239091
PCT Pub. Date: Dec. 2, 2021

(65) Prior Publication Data
US 2023/0178560 A1    Jun. 8, 2023

(30) Foreign Application Priority Data

May 29, 2020    (CN) .......................... 202010471830.8

(51) Int. Cl.
*H10D 86/01* (2026.01)
*H10D 86/40* (2025.01)
*H10D 86/60* (2025.01)

(52) U.S. Cl.
CPC ......... *H10D 86/60* (2025.01); *H10D 86/0221* (2025.01); *H10D 86/423* (2025.01)

(58) Field of Classification Search
CPC .. H10D 86/60; H10D 86/0221; H10D 86/423; H10D 30/6755; H10D 30/6728;
(Continued)

(56) References Cited

U.S. PATENT DOCUMENTS

| | | |
|---|---|---|
| 2012/0043542 A1 | 2/2012 | Yanagisawa |
| 2013/0105794 A1* | 5/2013 | Tomida ................ H10D 86/423 |
| | | 257/43 |

(Continued)

FOREIGN PATENT DOCUMENTS

| | | |
|---|---|---|
| CN | 104201195 A | 12/2014 |
| CN | 109087928 A | 12/2018 |

(Continued)

OTHER PUBLICATIONS

Macdonald, William A. "Latest advances in substrates for flexible electronics." Large Area and Flexible Electronics (2015): 291-314. (Year: 2015).*

(Continued)

*Primary Examiner* — Lex H Malsawma
*Assistant Examiner* — Ethan Edward Cutler
(74) *Attorney, Agent, or Firm* — IPro, PLLC

(57) ABSTRACT

The present disclosure provides a thin-film transistor and a method for manufacturing same, and an array substrate and a display panel. The thin-film transistor includes: a substrate; an oxide nanowire, which extends in a direction perpendicular to the substrate, and includes a first end face facing toward the substrate, a second end face facing away from the substrate, and a side surface; a gate insulting layer; a gate electrode; a passivation layer; a source electrode, which is located at the same side of the substrate as the oxide nanowire, an orthographic projection of the source electrode on the substrate does not overlap with an orthographic projection of the passivation layer on the substrate, and the (Continued)

source electrode is connected with the first end face of the oxide nanowire; and a drain electrode is in contact with the second end face of the oxide nanowire.

15 Claims, 4 Drawing Sheets

(58) Field of Classification Search
CPC ............. H10D 30/6757; H10D 62/122; H10D 62/235; H10D 99/00; G02F 1/1362
See application file for complete search history.

(56) References Cited

U.S. PATENT DOCUMENTS

| | | | |
|---|---|---|---|
| 2013/0285051 A1 | 10/2013 | Tanaka | |
| 2019/0245054 A1* | 8/2019 | Yang | ...................... H10D 62/81 |

| | | | | |
|---|---|---|---|---|
| 2019/0296155 A1* | 9/2019 | Sawabe | .................. | H10B 12/31 |
| 2019/0319104 A1 | 10/2019 | Levy et al. | | |
| 2020/0058691 A1* | 2/2020 | Huang | .................. | H10F 39/802 |
| 2020/0185535 A1 | 6/2020 | Guan et al. | | |

FOREIGN PATENT DOCUMENTS

| | | | |
|---|---|---|---|
| CN | 109524476 A | 3/2019 |
| CN | 111599870 A | 8/2020 |

OTHER PUBLICATIONS

CN202010471830.8 first office action.
CN202010471830.8 second office action.
CN202010471830.8 Decision of Rejection.
CN202010471830.8 Notice of Reexamination.
CN202010471830.8 Decision of Reexamination.
PCT/CN2021/096622 interanational search report.

* cited by examiner

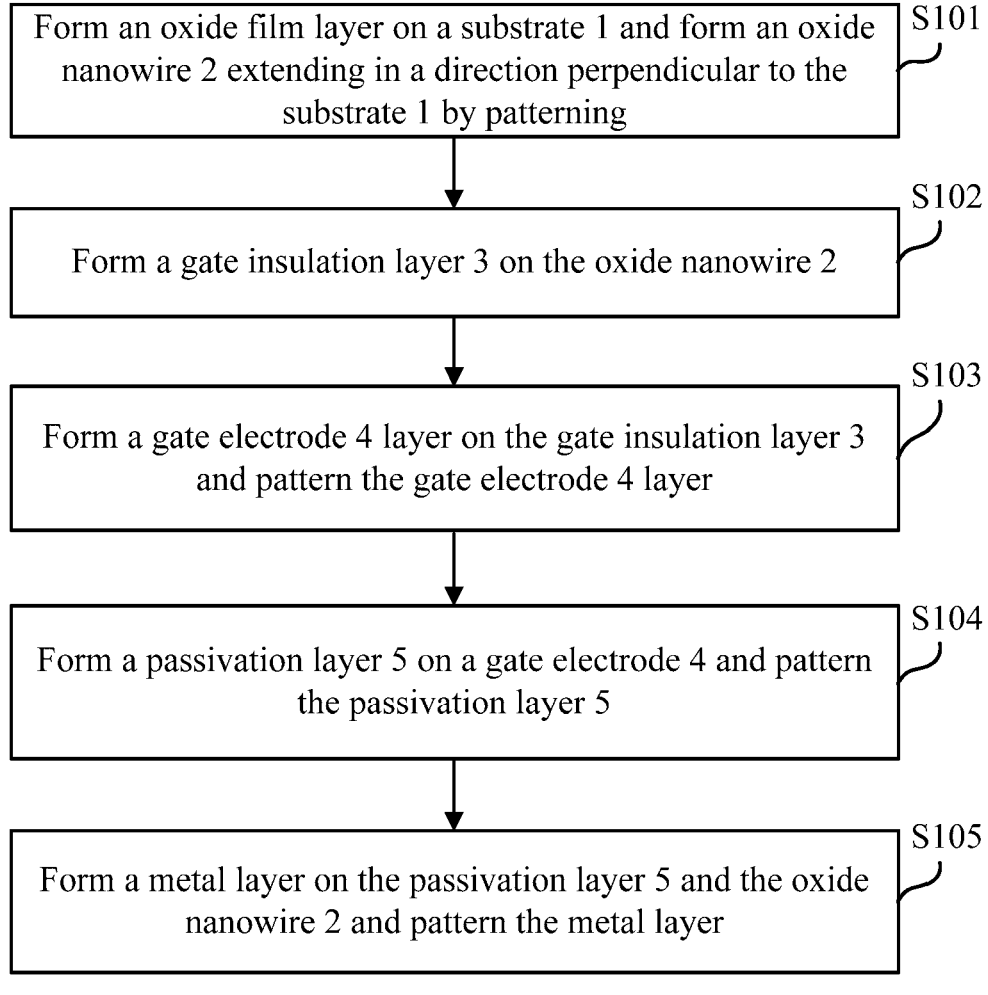

Form an oxide film layer on a substrate 1 and form an oxide nanowire 2 extending in a direction perpendicular to the substrate 1 by patterning ⌐ S101

Form a gate insulation layer 3 on the oxide nanowire 2 ⌐ S102

Form a gate electrode 4 layer on the gate insulation layer 3 and pattern the gate electrode 4 layer ⌐ S103

Form a passivation layer 5 on a gate electrode 4 and pattern the passivation layer 5 ⌐ S104

Form a metal layer on the passivation layer 5 and the oxide nanowire 2 and pattern the metal layer ⌐ S105

THIN-FILM TRANSISTOR AND ARRANGEMENT THEREOF AND METHOD FOR MANUFACTURING SAME

CROSS-REFERENCE OF RELATED APPLICATIONS

The present application is a National Stage of International Application No. PCT/CN2021/096622, filed May 28, 2021, which claims priority to Chinese Patent Application No. 202010471830.8, filed to the China National Intellectual Property Administration on May 29, 2020 and entitled "THIN-FILM TRANSISTOR AND METHOD FOR MANUFACTURING SAME, AND ARRAY SUBSTRATE AND DISPLAY PANEL", which is hereby incorporated by reference in its entirety.

FIELD OF INVENTION

The present disclosure relates to the technical field of display, in particular to a thin-film transistor and a method for manufacturing same, and an array substrate and a display panel.

BACKGROUND

With the increasing demand for a display effect, traditional a-Si LCD products can no longer meet the performance requirements of narrow bezel, high definition and high refresh frequency. Compared to a-Si thin-film transistors, oxide thin-film transistors have higher mobility to meet the requirements of high-end large size TV products, but at present, high transmissivity is the key to restrict the further improvement of the display effect, therefore, how to further improve the transmissivity of a display screen and improve the display effect is a problem that needs to be studied and solved urgently.

BRIEF SUMMARY

The present disclosure provides a thin-film transistor and a method for manufacturing same, and an array substrate and a display panel. The thin-film transistor provided by the present disclosure includes:

a substrate;

an oxide nanowire, which extends in a direction perpendicular to the substrate, and includes a first end face facing toward the substrate, a second end face facing away from the substrate, and a side surface connecting the first end face and the second end face;

a gate insulation layer, which surrounds the side surface of the oxide nanowire, exposes the second end face of the oxide nanowire, and has a gate insulation layer side surface surrounding the side surface of the oxide nanowire, and a gate insulation layer end face facing away from the substrate and connected to the gate insulation layer side surface;

a gate electrode, which surrounds the gate insulation layer side surface, exposes the second end face of the oxide nanowire, and is provided with a gate electrode side surface surrounding the gate insulation layer side surface, and a gate electrode end face facing away from the substrate and connected to the gate electrode side surface;

a passivation layer, which surrounds the gate electrode side surface, the gate electrode end face and the gate insulation layer end face, exposes the second end face,

2 and has a passivation layer side surface surrounding the gate electrode side surface, and a passivation layer end face covering the gate electrode end face and the gate insulation layer end face;

a source electrode, which is located at the same side of the substrate as the oxide nanowire, where an orthographic projection of the source electrode on the substrate does not overlap with an orthographic projection of the passivation layer on the substrate, and the source electrode is electrically connected to the first end face of the oxide nanowire; and a drain electrode, which is located on and is in contact with the second end face of the oxide nanowire.

In some embodiments, a thickness of the oxide nanowire is greater than or equal to 100 Å and less than or equal to 5000 Å.

In some embodiments, a maximum width of the oxide nanowire is greater than or equal to 40 nm and less than or equal to 60 nm.

In some embodiments, a thickness of the oxide nanowire is greater than a width of the oxide nanowire.

In some embodiments, the thin-film transistor further includes: an extension portion, and the extension portion extends on the substrate from the first end face of the oxide nanowire to a side away from the oxide nanowire; and the source electrode is in contact with and electrically connected with the extension portion.

In some embodiments, an orthographic projection of the gate electrode on the substrate does not overlap with an orthographic projection of the extension portion on the substrate.

In some embodiments, the passivation layer has a hollowed-out portion exposing the second end face of the oxide nanowire, and the drain electrode is in contact with and electrically connected with the second end face of the oxide nanowire through the hollowed-out portion.

In some embodiments, an orthographic projection of the hollowed-out portion on the substrate approximately overlaps with an orthographic projection of the oxide nanowire on the substrate.

In some embodiments, an orthographic projection of the drain electrode on the substrate covers the orthographic projection of the hollowed-out portion on the substrate.

In some embodiments, the gate insulation layer end face and the gate electrode end face are approximately on a same plane.

In some embodiments, the passivation layer end face and the second end face of the oxide nanowire are approximately on a same plane.

In some embodiments, a cross-sectional pattern of the oxide nanowire is circular, elliptical, square, rectangular or triangular.

In some embodiments, the oxide nanowire is a crystallized oxide nanowire.

In some embodiments, a crystallization direction of the oxide nanowire is perpendicular to the substrate.

An embodiment of the present disclosure further provides a method for manufacturing a thin-film transistor, configured to manufacture the thin-film transistor provided according to the embodiment of the present disclosure, and including:

forming an oxide film layer on a substrate and forming an oxide nanowire extending in a direction perpendicular to the substrate by patterning, wherein the oxide film layer includes a first end face facing toward the substrate, a second end face facing away from the substrate, and a side surface connecting the first end face to the second end face;

forming a gate insulation layer on the oxide nanowire, the gate insulation layer has a gate insulation layer side surface surrounding the side surface of the oxide nanowire, and a gate insulation layer end face facing away from the substrate and connected to the gate insulation layer side surface;

forming a gate electrode layer on the gate insulation layer, and patterning the gate electrode layer, to form a gate electrode surrounding the gate insulation layer side surface and exposing the second end face of the oxide nanowire, the gate electrode has a gate electrode side surface surrounding the gate insulation layer side surface, and a gate electrode end face facing away from the substrate and connected to the gate electrode side surface;

forming a passivation layer on the gate electrode, and patterning the passivation layer, to surround the gate electrode side surface, the gate electrode end face and the gate insulation layer end face, and expose the second end face of the oxide nanowire, the passivation layer has a passivation layer side surface surrounding the gate electrode side surface, and a passivation layer end face covering the gate electrode end face and the gate insulation layer end face; and forming a metal layer on the passivation layer and the oxide nanowire, and patterning the metal layer, to form a source electrode electrically connected to the first end face of the oxide nanowire, and a drain electrode electrically connected to the second end face of the oxide nanowire.

In some embodiments, the forming an oxide film layer on a substrate and forming an oxide nanowire extending in a direction perpendicular to the substrate by patterning In some embodiments includes:

patterning the oxide film layer by using an exposure development technology to form the oxide nanowire, and an extension portion extending on the substrate from the first end face of the oxide nanowire to a side away from the oxide nanowire at an end of the oxide nanowire facing toward the substrate; and forming the passivation layer on the gate electrode and patterning the passivation layer to expose the second end face of the oxide nanowire facing away from the substrate, to expose the extension portion by forming a through hole in a portion, corresponding to the extension portion, of the passivation layer, wherein the passivation layer covers the gate electrode.

In some embodiments, the forming a metal layer on the passivation layer and the oxide nanowire includes:

depositing metal on the passivation layer and the oxide nanowire, and performing plasma bombarding on the metal deposited on the passivation layer and the oxide nanowire during deposition of the metal, to make an end portion, facing away from the substrate, of the oxide nanowire and the extension portion conductive.

An embodiment of the present disclosure further provides an array substrate, including the thin-film transistor provided according to the embodiment of the present disclosure. In some embodiments, the substrate is a flexible substrate.

An embodiment of the present disclosure further provides a display panel, including the array substrate provided according to the embodiment of the present disclosure.

BRIEF DESCRIPTION OF THE DRAWINGS

FIG. 6 is a schematic flow diagram of a method for manufacturing a thin-film transistor provided according to an embodiment of the present disclosure.

Figure 1:
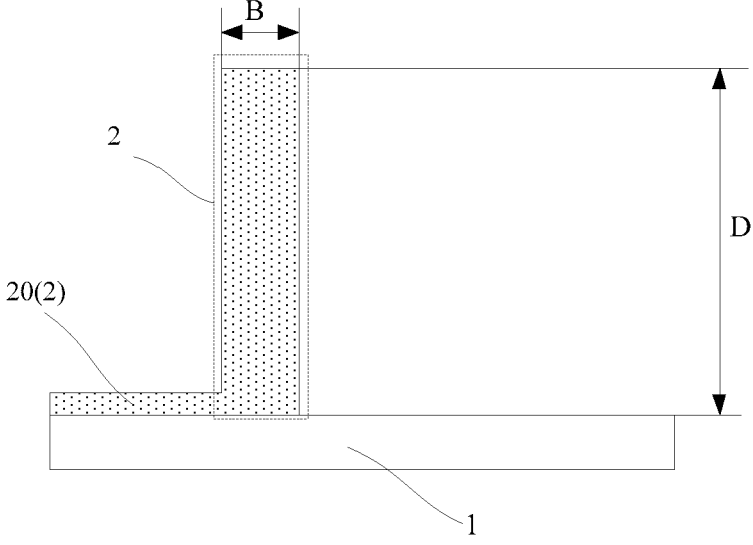
FIG. 1 to FIG. 5 are schematic diagrams of film layer structure change in a manufacturing process of a thin-film transistor provided according to an embodiment of the present disclosure.

Reference numerals: 1—Substrate; 2—Oxide nanowire; 3—Gate insulation layer; 4—Gate electrode; 5—Passivation layer; 6—Source electrode; 7—Drain electrode; 21—Extension portion.

DETAILED DESCRIPTION OF THE EMBODIMENTS

The technical solutions of embodiments of the present disclosure will be described below clearly and completely in combination with the accompanying drawings of the embodiments of the present disclosure. Apparently, the described embodiments are some, but not all, embodiments of the present disclosure. Based on the embodiments of the present disclosure, all other embodiments obtained by those of ordinary skill in the art without creative work shall fall within the protection scope of the present disclosure.

Figure 5:
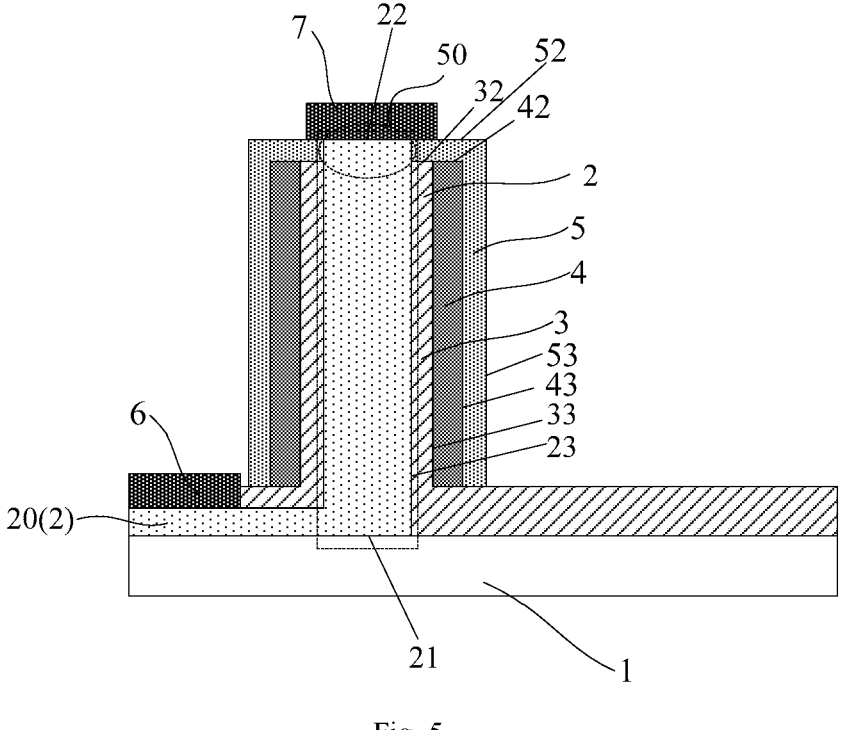

As shown in FIG. 5, FIG. 5 is a schematic structural diagram of a thin-film transistor provided according to an embodiment of the present disclosure. An embodiment of the present disclosure provides a thin-film transistor, including:

a substrate 1;

an oxide nanowire 2, which extends in a direction perpendicular to the substrate 1, and includes a first end face 21 facing toward the substrate 1, a second end face 22 facing away from the substrate 1, and a side surface 23 connecting the first end face 21 and the second end face 22;

a gate insulation layer 3, which surrounds the side surface 23 of the oxide nanowire 2, exposes the second end face 22 of the oxide nanowire 2, and has a gate insulation layer side surface 33 surrounding the side surface 23 of the oxide nanowire 2, and a gate insulation layer end face 32 facing away from the substrate 1 and connected to the gate insulation layer side surface 33;

a gate electrode 4, which surrounds the gate insulation layer side surface 33, exposes the second end face 22 of the oxide nanowire 2, and has a gate electrode side surface 43 surrounding the gate insulation layer side surface 33, and a gate electrode end face 42 facing away from the substrate 1 and connected to the gate electrode side surface 43;

a passivation layer 5, which surrounds the gate electrode side surface 43, the gate electrode end face 42 and the gate insulation layer end face 32, exposes the second end face 22 of the oxide nanowire 2, and has a passivation layer side surface 53 surrounding the gate electrode side surface 43, and a passivation layer end face 52 covering the gate electrode end face 42 and the gate insulation layer end face 32;

a source electrode 6, which is located at a same side of the substrate 1 as the oxide nanowire 2, wherein an orthographic projection of the source electrode 6 on the substrate 1 does not overlap with an orthographic projection of the passivation layer 5 on the substrate 1, and the source electrode 6 is electrically connected to the first end face 21 of the oxide nanowire 2; and a drain electrode 7, which is located on and is in contact with the second end face 22 of the oxide nanowire 2.

In the above-mentioned thin-film transistor, for the sake of illustration, the direction perpendicular to the substrate 1 is taken as a vertical direction and a direction parallel to the surface of the substrate 1 is taken as a horizontal direction. The thin-film transistor in the present disclosure is an oxide thin-film transistor, including the oxide nanowire 2 disposed on the substrate 1, the oxide nanowire 2 is a crystal and an active layer of the thin-film transistor, the oxide nanowire 2 is disposed extending in a thickness direction (i.e., the vertical direction) of the substrate 1 to form a crystallized nanowire, the oxide nanowire 2 is surrounded by the gate insulation layer 3, the gate electrode 4 is disposed on the outer circumferential side of the gate insulation layer 3 and surrounds the oxide nanowire 2, the gate electrode 4 may be disposed all around the oxide nanowire 2, or locally on the circumference of the oxide nanowire 2, as long as the gate electrode 4 is disposed on the circumferential side of the oxide nanowire 2, so that the gate electrode 4 can provide a voltage signal to the oxide nanowire 2, the passivation layer 5 is disposed on the gate electrode 4 and covers the gate electrode 4, a hole may be formed in a portion, corresponding to the top of the oxide nanowire 2, of the passivation layer 5 so as to expose the top of the oxide nanowire 2, the source electrode 6 is disposed on one side of the circumferential side of the oxide nanowire 2, the source electrode 6 is connected to the end of the oxide nanowire 2 facing toward the substrate 1, that is, to the bottom of the oxide nanowire 2 to form an electrical connection, the drain electrode 7 is disposed on the side of the oxide nanowire 2 away from the substrate 1, and the drain electrode 7 is disposed on the top of the oxide nanowire 2 to be connected to the oxide nanowire 2 to form an electrical connection. That is, a trench length of the above-mentioned thin-film transistor is formed by extending in the direction perpendicular to the substrate 1, the above-mentioned thin-film transistor is formed as a perpendicular TFT, and the active layer in the above-mentioned thin-film transistor is the oxide nanowire 2, which can substantially reduce the defect state of the active layer and effectively improve the mobility and stability of the thin-film transistor, and thus, when applied to display panels, the structure dimension of the thin-film transistor can be made smaller, and the transmissivity of the display panels is further improved. The above-mentioned thin-film transistor is of a perpendicular TFT structure, and the active layer of the thin-film transistor is arranged in the direction perpendicular to the substrate 1, which can effectively avoid the phenomenon that the active layer is too long in the horizontal direction of the substrate 1 to be folded and broken in the design and application of flexible screens, bending screens or folding screens. The trench length of the above-mentioned thin-film transistor extends in the direction perpendicular to the substrate 1, and when a display screen is bent, a trench layer is less affected, which is conducive to ensuring the stability of the thin-film transistor.

Therefore, the active layer of the above-mentioned thin-film transistor is the oxide nanowire and is disposed extending in the direction perpendicular to the substrate, so as to form the perpendicular TFT structure, which effectively improves the mobility and stability of the thin-film transistor and can reduce the structure dimension and effectively improve the transmissivity of the display screen when applied to the display screen.

In some embodiments, as shown in FIG. 1, in the above-mentioned thin-film transistor, a thickness D of the oxide nanowire 2 is greater than or equal to 100 Å and less than or equal to 5000 Å, i.e., the thickness D of the oxide nanowire 2 in the direction perpendicular to the substrate 1 is greater than or equal to 100 Å and less than or equal to 5000 Å. A dimension of the oxide nanowire 2 in the direction perpendicular to the substrate 1 may be selected in the range of 100 Å to 5000 Å to choose a suitable thickness, which can make the performance of the above-mentioned thin-film transistor better and the dimension more suitable, preferably, the thickness of the oxide nanowire 2 in the direction perpendicular to the substrate 1 may be set to 200 Å, 300 Å, 500 Å, 1000 Å, 1500 Å, 2000 Å, 3000 Å or 4000 Å, or other values, which may be set according to the actual needs, and not limited by the present embodiment.

As shown in FIG. 1, in the above-mentioned thin-film transistor, a shape of the oxide nanowire 2 may be a bar-shaped column, a length direction of the oxide nanowire is perpendicular to the substrate 1, In some embodiments, a clean oxide semiconductor may be a cylindrical type with its central axis perpendicular to the substrate 1, and the oxide nanowire 2 may also be a rectangular type, or other shapes, which is not limited by the present embodiment. In the cross section of the above-mentioned oxide nanowire 2 perpendicular to the substrate 1, a dimension B of the cross section in a direction parallel to the substrate 1 is greater than or equal to 40 nm or less than or equal to 60 nm, i.e., the maximum width of the oxide nanowire 2 is greater than or equal to 40 nm and less than or equal to 60 nm, preferably, 45 nm, 48 nm, 50 nm, 52 nm, or 55 nm, or other dimensional values, which is not limited by the present embodiment.

In some embodiments, the thickness D of the oxide nanowire 2 is greater than the width B of the oxide nanowire 2, i.e., the thickness D of the oxide nanowire 2 in the direction perpendicular to the substrate 1 is greater than the thickness B of the oxide nanowire 2 in the direction parallel to the substrate 1.

In some embodiments, a material of the gate insulation layer may be silicon oxide, and a thickness of the gate insulation layer may be set to 300 Å to 2000 Å.

Figures 3, 4:
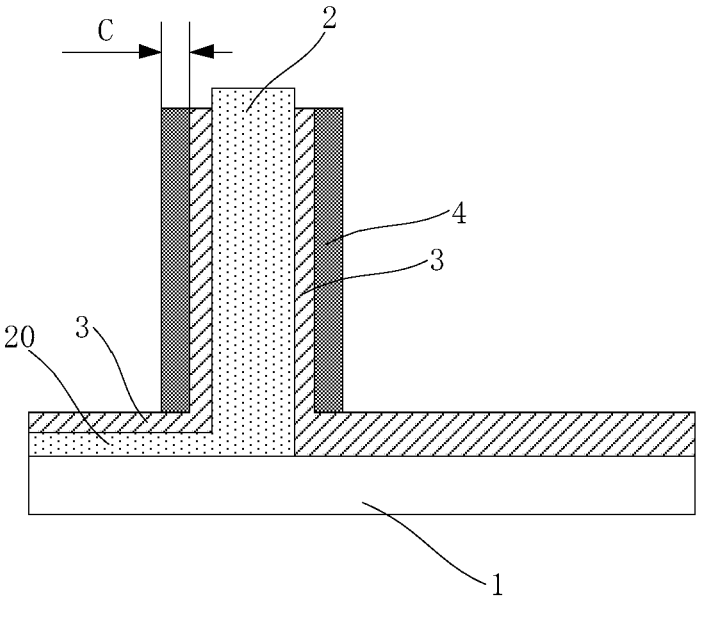

In some embodiments, as shown in FIG. 3, the gate electrode 4 may be copper, molybdenum or a laminated structure of copper and molybdenum, and the gate electrode 4 is disposed on the circumferential side of the oxide nanowire 2 and is attached to the outer surface of the gate insulation layer 3 on the circumferential side of the oxide nanowire 2. A thickness dimension C of the gate electrode 4 in the direction parallel to the substrate 1 is 1000 Å to 6000 Å, preferably, it may be set to 2000 Å, 2500 Å, 3000 Å, 4000 Å or 5000 Å, or other dimensional values, which is not limited in the present embodiment.

The passivation layer may be silicon oxide, silicon nitride or a laminated structure of silicon oxide and silicon nitride, and a thickness of the passivation layer may be set to 2000 Å to 6000 Å.

In some embodiments, as shown in FIG. 5, in the above-mentioned thin-film transistor, the oxide nanowire 2 further includes: an extension portion 20, which extends on the substrate 1 from the first end face 21 of the oxide nanowire 2 to a side away from the oxide nanowire 2; and the source electrode 6 is in contact with and electrically connected with the extension portion 20, the source electrode 6 is disposed on the extension portion 20 and electrically connected to the extension portion 20, and the extension portion 20 may be of an integrated structure with the oxide nanowire 2 and formed in the same preparation process, to facilitate the electrical connection between the source electrode 6 and the oxide nanowire 2.

In some embodiments, as shown in FIG. 3, in the above-mentioned thin-film transistor, the gate electrode 4 is disposed around the oxide nanowire 2 and surrounds the outer circumferential side of the gate insulation layer 3, and the gate electrode 4 completely surrounds the circumferential side of the oxide nanowire 2, which can better apply an electrical signal to the active layer and is conducive to improving the sensitivity of the thin-film transistor.

In some embodiments, as shown in FIG. 5, the passivation layer 5 has a hollowed-out portion 50 that exposes the second end face 22 of the oxide nanowire 2, and the drain electrode 7 is in contact with and electrically connected to the second end face 22 of the oxide nanowire 2 through the hollowed-out portion 50. In some embodiments, an orthographic projection of the hollowed-out portion 50 on the substrate 1 approximately coincides with an orthographic projection of the oxide nanowire 2 on the substrate 1.

In some embodiments, as shown in FIG. 5, an orthographic projection of the drain electrode 7 on the substrate 1 covers the orthographic projection of the hollowed-out portion 50 on the substrate 1.

In some embodiments, as shown in FIG. 5, the gate insulation layer end face 32 and the gate electrode end face 42 are approximately located on a same plane.

In some embodiments, as shown in FIG. 5, the passivation layer end face 52 and the second end face 22 are approximately located on the same plane.

In some embodiments, as shown in FIG. 5, a cross-sectional pattern of the oxide nanowire 2 is circular, elliptical, square, rectangular or triangular. In some embodiments, the cross section may be understood as a plane parallel to the substrate 1.

In some embodiments, the oxide nanowire 2 is a crystallized oxide nanowire. In some embodiments, a crystallization direction of the oxide nanowire 2 is perpendicular to the substrate 1.

In some embodiments, an insulating dielectric layer and an ITO layer are formed on the source electrode and the drain electrode, so as to electrically connect the thin-film transistor to other devices to perform the corresponding functions.

Figure 2:
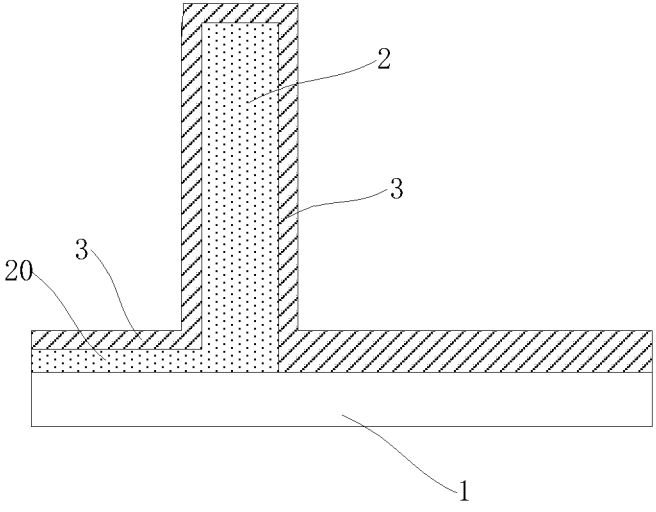

Based on the same disclosed concept, as shown in FIG. 6, as shown in FIG. 1 to FIG. 5, the present disclosure further provides a method for manufacturing a thin-film transistor, configured to manufacture any one of the thin-film transistors as provided in the above technical solution, and including:

step S101, as shown in FIG. 1, an oxide film layer is formed on a substrate 1, and an oxide nanowire 2 extending in a direction perpendicular to the substrate 1 is formed by patterning;

step S102, as shown in FIG. 2, a gate insulation layer 3 is formed on the oxide nanowire 2;

step S103, as shown in FIG. 3, a gate electrode 4 layer is formed on the gate insulation layer 3 and is subjected to patterning to form a gate electrode 4 which surrounds the gate insulation layer side surface 33 and exposes the second end face 22, that is, the gate electrode 4 which is disposed around the crystallized oxide and located on the outer circumferential side of the gate insulation layer 3 is formed;

step S104, as shown in FIG. 4, a passivation layer 5 is formed on the gate electrode 4 and is subjected to patterning, so that the top of oxide nanowire 2 is exposed, and the passivation layer 5 covers the gate electrode 4; and step S105, as shown in FIG. 5, a metal layer is formed on the passivation layer 5 and the oxide nanowire 2, and is subjected to patterning, to form a source electrode 6 which is located on one side of the oxide nanowire 2 and electrically connected to one end of the oxide nanowire 2 facing toward the substrate 1, and a drain electrode 7 which is located on one side of the crystallized oxide facing away from the substrate 1 and electrically connected to the oxide nanowire 2.

The active layer of the thin-film transistor manufactured according to the above manufacturing method is the oxide nanowire and is disposed extending in the direction perpendicular to the substrate, so as to form the perpendicular TFT structure, which effectively improves the mobility and stability of the thin-film transistor and can reduce the structure dimension and effectively improve the transmissivity of the display screen when applied to the display screen.

In some embodiments, in step S101, as shown in FIG. 1, the forming an oxide nanowire 2 extending in a direction perpendicular to the substrate 1 by patterning includes: patterning the oxide film layer by using an exposure development technology to form the oxide nanowire 2, and forming an extension portion 20 extending toward one side of the circumferential side at an end of the oxide nanowire 2 facing toward the substrate 1; and in the subsequent step S104, as shown in FIG. 4, the forming the passivation layer 5 on the gate electrode 4 and patterning the passivation layer 5 includes: forming the passivation layer 5 on the gate electrode 4 and patterning the passivation layer 5, so that the top of the oxide nanowire 2 is exposed, a through hole is formed in a portion, corresponding to the extension portion 20, of the passivation layer 5 so as to expose the extension portion 20, and the passivation layer 5 covers the gate electrode 4.

In some embodiments, in step S105, as shown in FIG. 5, the forming a metal layer on the passivation layer 5 and the oxide nanowire 2 includes: depositing metal on the passivation layer 5 and the oxide nanowire 2, and performing plasma bombarding on the metal deposited on the passivation layer 5 and the oxide nanowire 2 during deposition of the metal, so as to conduct an end portion of the oxide nanowire 2 away from a side of the substrate 1 and to conduct the extension portion 20, wherein when the metal configured to prepare the source electrode 6 and the drain electrode 7 is deposited, plasma bombarding is performed at the same time, the exposed top of the oxide nanowire 2 away from the substrate 1 may be conducted, the extension portion 20 is conducted, and a trench is formed in a portion, between the source electrode 6 and the drain electrode 7, of the oxide nanowire 2.

The present disclosure further provides an array substrate including the thin-film transistor as provided in the above embodiment, the thin-film transistor is disposed in a display region of the array substrate, and the thin-film transistor in the display region is located within each sub-pixel unit, which can effectively increase the light transmissivity of the display region; and in addition, the thin-film transistor may also be disposed in a non-display region of the array substrate, such as a wiring region, which can effectively reduce the bezel width and realize a narrow bezel design.

In some embodiments, in the above-mentioned array substrate, a substrate of the array substrate may be a flexible substrate, then the above-mentioned array substrate may be configured to form a flexible display panel, to ensure the stability of the thin-film transistor, ensure the normal display of the flexible display panel when bending, and prolong the service life of the flexible display panel.

The present disclosure further provides a display panel, including any array substrate as provided according to the above embodiment.

Obviously, those skilled in the art can make various modifications and variations to the embodiments of the present disclosure without departing from the spirit and scope of the present disclosure. In this way, if these modifications and variations of the present disclosure fall within the scope of the claims of the present disclosure and equivalent technologies thereof, the present disclosure is also intended to include these modifications and variations.

What is claimed is:

1. A method for manufacturing a thin-film transistor, wherein the thin-film transistor comprises:

a substrate;

an oxide nanowire, extending in a direction perpendicular to the substrate, and comprising a first end face facing toward the substrate, a second end face facing away from the substrate, and a side surface connecting the first end face and the second end face;

a gate insulation layer, surrounding the side surface of the oxide nanowire, exposing the second end face of the oxide nanowire, and having a gate insulation layer side surface surrounding the side surface of the oxide nanowire, and a gate insulation layer end face facing away from the substrate and connected to the gate insulation layer side surface;

a gate electrode, surrounding the gate insulation layer side surface, exposing the second end face of the oxide nanowire, and having a gate electrode side surface surrounding the gate insulation layer side surface, and a gate electrode end face facing away from the substrate and connected to the gate electrode side surface;

a passivation layer, surrounding the gate electrode side surface, the gate electrode end face and the gate insulation layer end face, exposing the second end face of the oxide nanowire, and having a passivation layer side surface surrounding the gate electrode side surface, and a passivation layer end face covering the gate electrode end face and the gate insulation layer end face;

a source electrode, located at a same side of the substrate as the oxide nanowire, wherein an orthographic projection of the source electrode on the substrate does not overlap with an orthographic projection of the passivation layer on the substrate; in a direction parallel to the substrate, the source electrode is located at a side of the passivation layer facing away from the oxide nanowire; and the source electrode is electrically connected to the first end face of the oxide nanowire; and a drain electrode, located on and in contact with the second end face of the oxide nanowire;

wherein the method comprises:

forming an oxide film layer on the substrate and forming the oxide nanowire extending in the direction perpendicular to the substrate by patterning, wherein the oxide film layer comprises a first end face facing toward the substrate, a second end face facing away from the substrate, and a side surface connecting the first end face to the second end face;

forming the gate insulation layer on the oxide nanowire, wherein the gate insulation layer has the gate insulation layer side surface surrounding the side surface of the oxide nanowire, and the gate insulation layer end face facing away from the substrate and connected to the gate insulation layer side surface;

forming a gate electrode layer on the gate insulation layer, and patterning the gate electrode layer, to form the gate electrode surrounding the gate insulation layer side surface and exposing the second end face of the oxide nanowire, wherein the gate electrode has the gate electrode side surface surrounding the gate insulation layer side surface, and the gate electrode end face facing away from the substrate and connected to the gate electrode side surface;

forming the passivation layer on the gate electrode, and patterning the passivation layer, to surround the gate electrode side surface, the gate electrode end face and the gate insulation layer end face, and expose the second end face of the oxide nanowire, wherein the passivation layer has the passivation layer side surface surrounding the gate electrode side surface, and the passivation layer end face covering the gate electrode end face and the gate insulation layer end face; and forming a metal layer on the passivation layer and the oxide nanowire, and patterning the metal layer, to form the source electrode electrically connected to the first end face of the oxide nanowire, and a drain electrode electrically connected to the second end face of the oxide nanowire;

wherein the forming a metal layer on the passivation layer and the oxide nanowire, comprises:

depositing metal on the passivation layer and the oxide nanowire, and performing plasma bombarding on the metal deposited on the passivation layer and the oxide nanowire during deposition of the metal, to make an end portion, facing away from the substrate, of the oxide nanowire and the extension portion conductive.

2. The manufacturing method according to claim 1, wherein the forming an oxide film layer on a substrate and forming an oxide nanowire extending in a direction perpendicular to the substrate by patterning comprises:

patterning the oxide film layer by using an exposure development technology to form the oxide nanowire, and an extension portion extending on the substrate from the first end face of the oxide nanowire to a side away from the oxide nanowire at an end of the oxide nanowire facing toward the substrate; and forming the passivation layer on the gate electrode and patterning the passivation layer to expose the second end face of the oxide nanowire facing away from the substrate, to expose the extension portion by forming a through hole in a portion, corresponding to the extension portion, of the passivation layer, wherein the passivation layer covers the gate electrode.

3. The method according to claim 1, wherein a thickness of the oxide nanowire is greater than or equal to 100 Å and less than or equal to 5000 Å.

4. The method according to claim 1, wherein a maximum width of the oxide nanowire is greater than or equal to 40 nm and less than or equal to 60 nm.

5. The method according to claim 1, wherein a thickness of the oxide nanowire is greater than a width of the oxide nanowire.

6. The method according to claim 1, the thin-film transistor further comprises: an extension portion;

wherein the extension portion extends on the substrate from the first end face of the oxide nanowire to a side away from the oxide nanowire; and the source electrode is in contact with and electrically connected with the extension portion.

7. The method according to claim 6, wherein an orthographic projection of the gate electrode on the substrate does not overlap with an orthographic projection of the extension portion on the substrate.

8. The method according to claim 1, wherein the passivation layer has a hollowed-out portion exposing the second end face of the oxide nanowire; and the drain electrode is in contact with and electrically connected with the second end face of the oxide nanowire through the hollowed-out portion.

9. The method according to claim 8, wherein an orthographic projection of the hollowed-out portion on the substrate approximately overlaps with an orthographic projection of the oxide nanowire on the substrate.

10. The method according to claim 9, wherein an orthographic projection of the drain electrode on the substrate covers the orthographic projection of the hollowed-out portion on the substrate.

11. The method according to claim 1, wherein the gate insulation layer end face and the gate electrode end face are approximately on a same plane.

12. The method according to claim 11, wherein the passivation layer end face and the second end face of the oxide nanowire are approximately on a same plane.

13. The method according to claim 1, wherein a cross-sectional pattern of the oxide nanowire is circular, elliptical, square, rectangular or triangular.

14. The method according to claim 1, wherein the oxide nanowire is a crystallized oxide nanowire.

15. The method according to claim 14, wherein a crystallization direction of the oxide nanowire is perpendicular to the substrate.

* * * * *